United States Patent [19]

Swinbanks

[11] 4,423,289

[45] Dec. 27, 1983

[54] SIGNAL PROCESSING SYSTEMS

[75] Inventor: Malcolm A. Swinbanks, Cambridge, England

[73] Assignee: National Research Development Corporation, London, England

[21] Appl. No.: 162,242

[22] Filed: Jun. 23, 1980

[30] Foreign Application Priority Data

Jun. 28, 1979 [GB] United Kingdom ............... 7922572

[51] Int. Cl.$^3$ .............................................. E04B 1/99
[52] U.S. Cl. ........................................ 381/71; 381/99
[58] Field of Search ..................... 179/1 D, 1 F, 1 P; 375/12, 14, 15; 455/305; 84/1.19, 1.23, DIG. 9

[56] References Cited

U.S. PATENT DOCUMENTS

| | | | |
|---|---|---|---|
| 3,591,699 | 7/1971 | Cutler | 84/1.19 |
| 3,755,738 | 8/1973 | Gitlin et al. | 375/15 |
| 3,936,606 | 2/1976 | Wanke | 179/1 P |
| 4,025,724 | 5/1977 | Davidson, Jr. et al. | 179/1 P |
| 4,044,203 | 8/1977 | Swinbanks | 179/1 P |
| 4,109,108 | 8/1978 | Coxon et al. | 179/1 P |
| 4,118,601 | 10/1978 | Yeap | 179/1 D |
| 4,122,303 | 10/1978 | Chaplin et al. | 179/1 P |
| 4,130,727 | 12/1978 | Kates | 179/1 D |
| 4,171,465 | 10/1979 | Swinbanks | 179/1 P |
| 4,218,950 | 8/1980 | Uetrecht | 84/1.19 |
| 4,276,802 | 7/1981 | Mieda | 84/DIG. 9 |

FOREIGN PATENT DOCUMENTS 1456018 11/1976 United Kingdom .
1548362 7/1979 United Kingdom .

OTHER PUBLICATIONS

"The Active Control of Sound Propagation in Long Ducts", M. A. Swinbanks, pp. 411–436, Journal of Sound & Vibration, vol. 27, 1973.
R. E. Bogner, "Frequency Sampling Filters", Introduction to Digital Filtering, pp. 139–147, (Chapt. 8), (Wiley), 1975.

Primary Examiner—G. Z. Rubinson
Assistant Examiner—Randall P. Myers
Attorney, Agent, or Firm—Cushman, Darby & Cushman

[57] ABSTRACT

A signal processing system which can be readily adjusted to achieve a desired complex transfer function of arbitrary form. The system comprises a frequency sampling filter system from each individual filter of which in-phase and quadrature components are derivable. The sum of these components for all the filters is obtained to provide the output of the system, the proportions in which the components are summed being independently variable for each component, for example by adjustment of attenuators or multipliers. Such a system has particular application in the field of active sound control.

8 Claims, 13 Drawing Figures

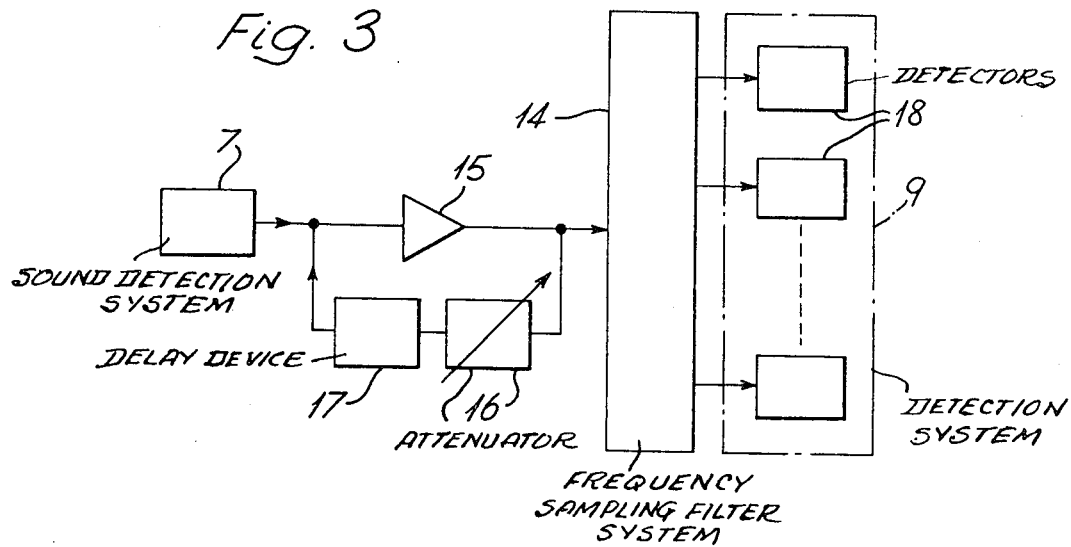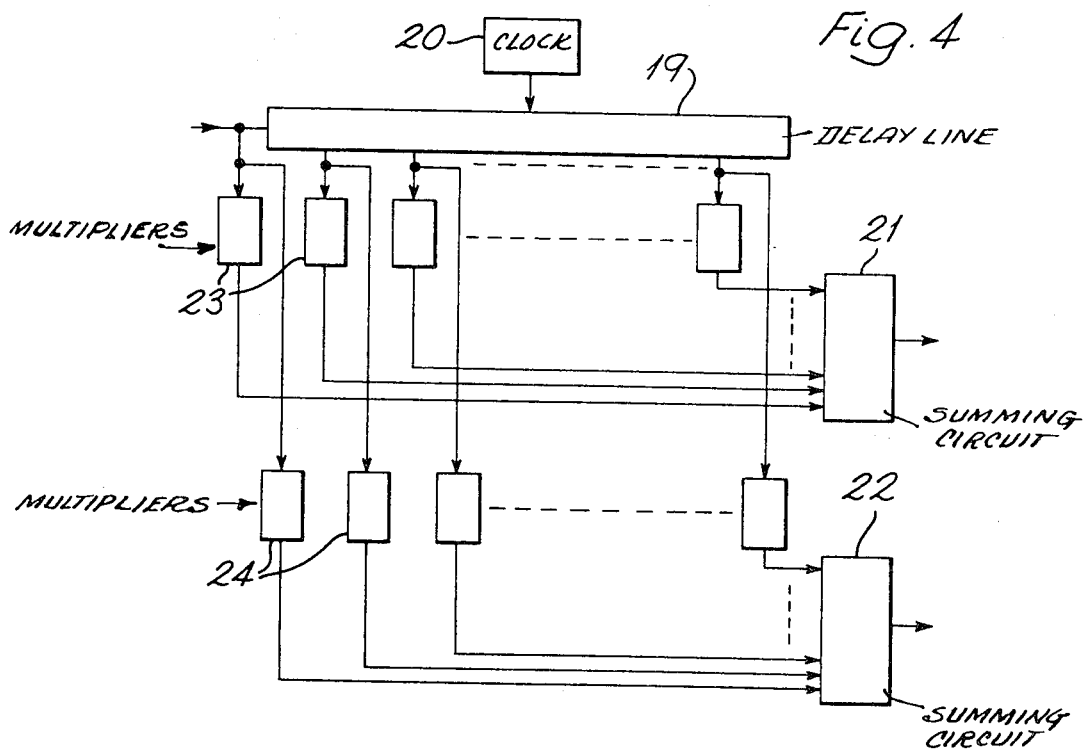

SIGNAL PROCESSING SYSTEMS

In certain fields a requirement exists for a signal processing system which can be readily adjusted to achieve a desired complex transfer function of arbitrary form. The present invention affords a means of meeting this requirement by taking advantage of the properties of frequency sampling filter systems. A frequency sampling filter system is a system operative so as effectively to constitute a set of filters which have a common input and which have amplitude response characteristics respectively exhibiting peaks at a series of frequencies (one of which may be zero), the characteristic for each filter having substantially zero value at all frequencies of this series other than that at which that characteristic exhibits a peak.

According to the invention, a signal processing system comprises a frequency sampling filter system and means for obtaining the sum of in-phase and quadrature components derivable from the individual filters of the filter system, with the summation taken over all the filters in proportions which are independently variable for each component.

With such a signal processing system, adjustments of the controls setting the respective proportions for the various components, made either manually or automatically in response to monitoring of the performance of the system, enable a desired complex transfer function to be matched on a point by point basis at the series of frequencies associated with the filter system. The controls are essentially non-interactive, so that overall adjustment of the system can be effected rapidly; in particular, when automatic operation is involved the controls relating to at least some of the different filters can be adjusted simultaneously. As will be further explained below, more accurate matching of the desired transfer function can be achieved if provision is made for variable feedback in the frequency sampling filter system.

One field in which signal processing systems according to the invention have particular application is that of active sound control. The invention will therefore be further described and explained with reference to its use specifically in that field, but it is to be understood that this does not imply any limitation in respect of the general utility of signal processing systems according to the invention.

In the following description, reference will be made to the accompanying drawings, in which:

FIG. 3 shows an arrangement which may usefully be incorporated in the system of FIG. 1;

FIG. 4 illustrates one mode of realisation of a filter used in a system according to the invention;

Figure 2:
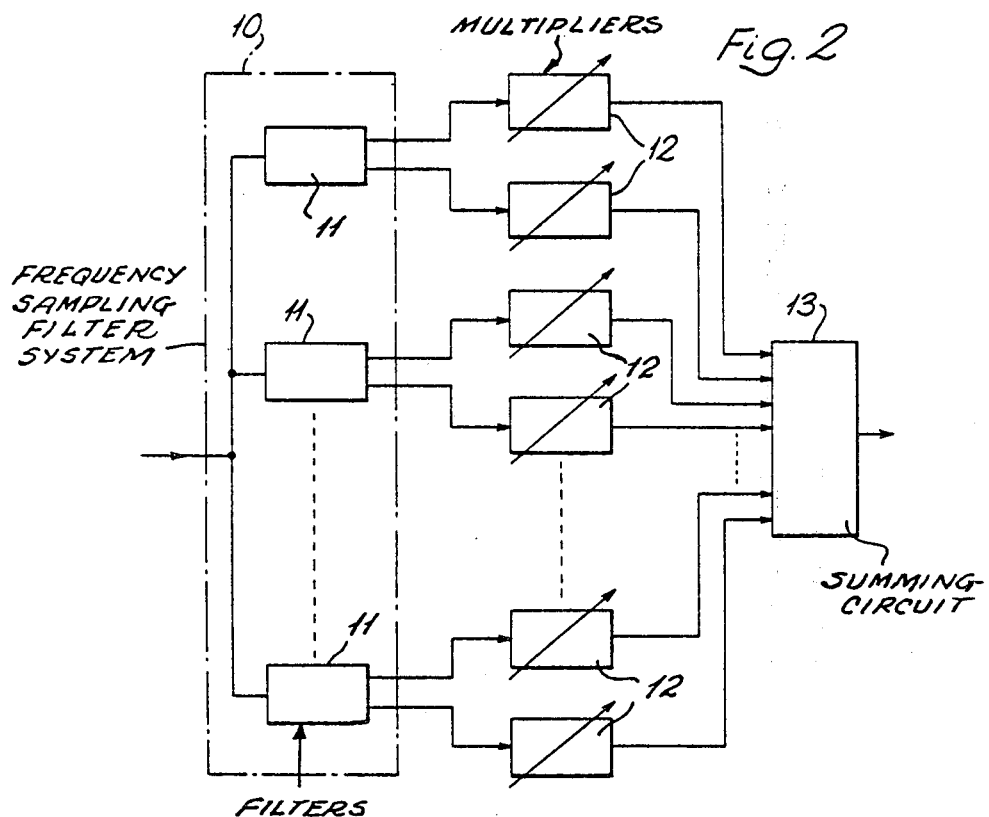
FIG. 2 is a diagram illustrating the principles of one signal processing system according to the invention.
Figure 7:
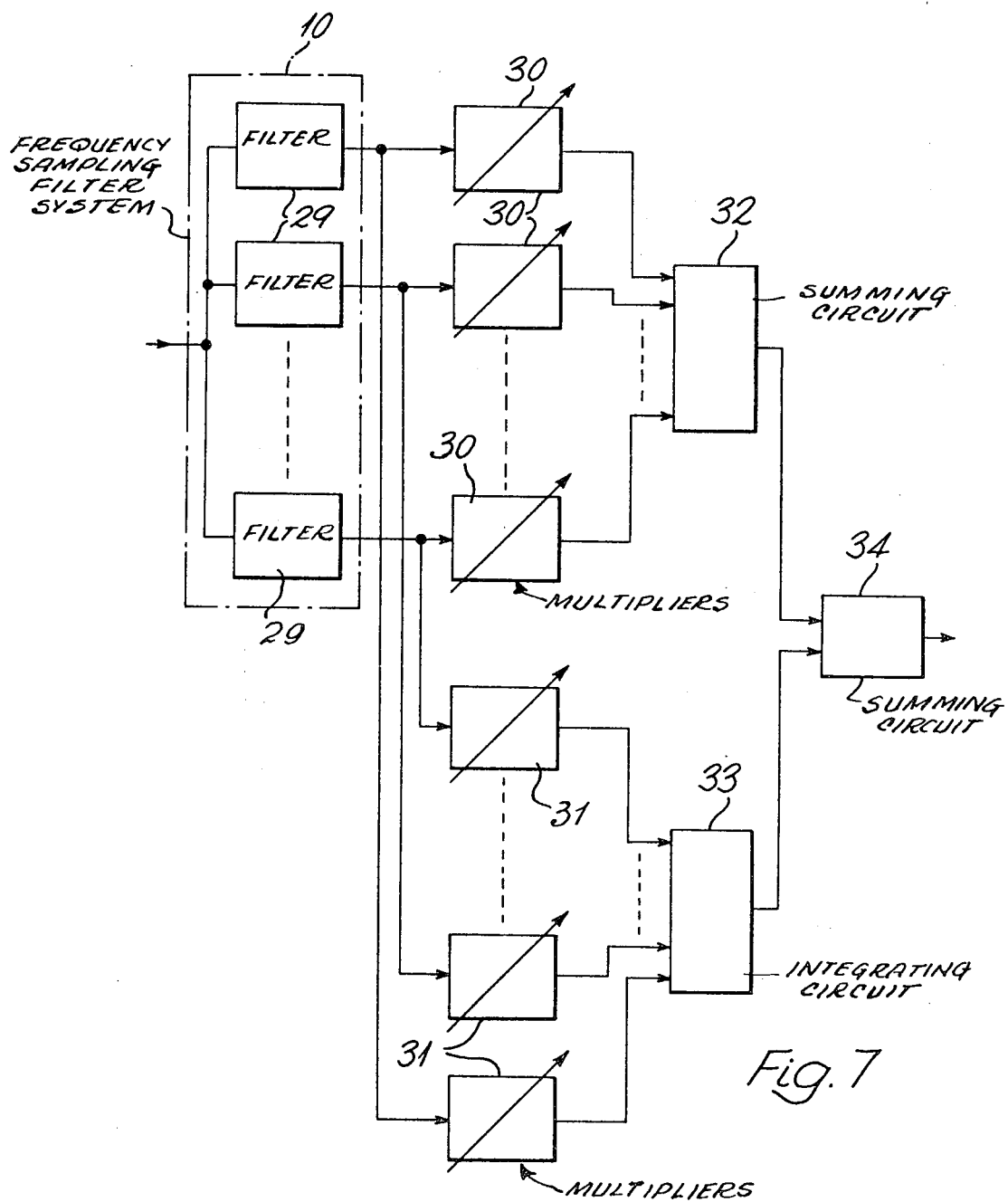

FIGS. 6(a) to 6(f) are explanatory diagrams;

FIG. 7 illustrates a modification of the system represented in FIG. 2; and

Figure 8:
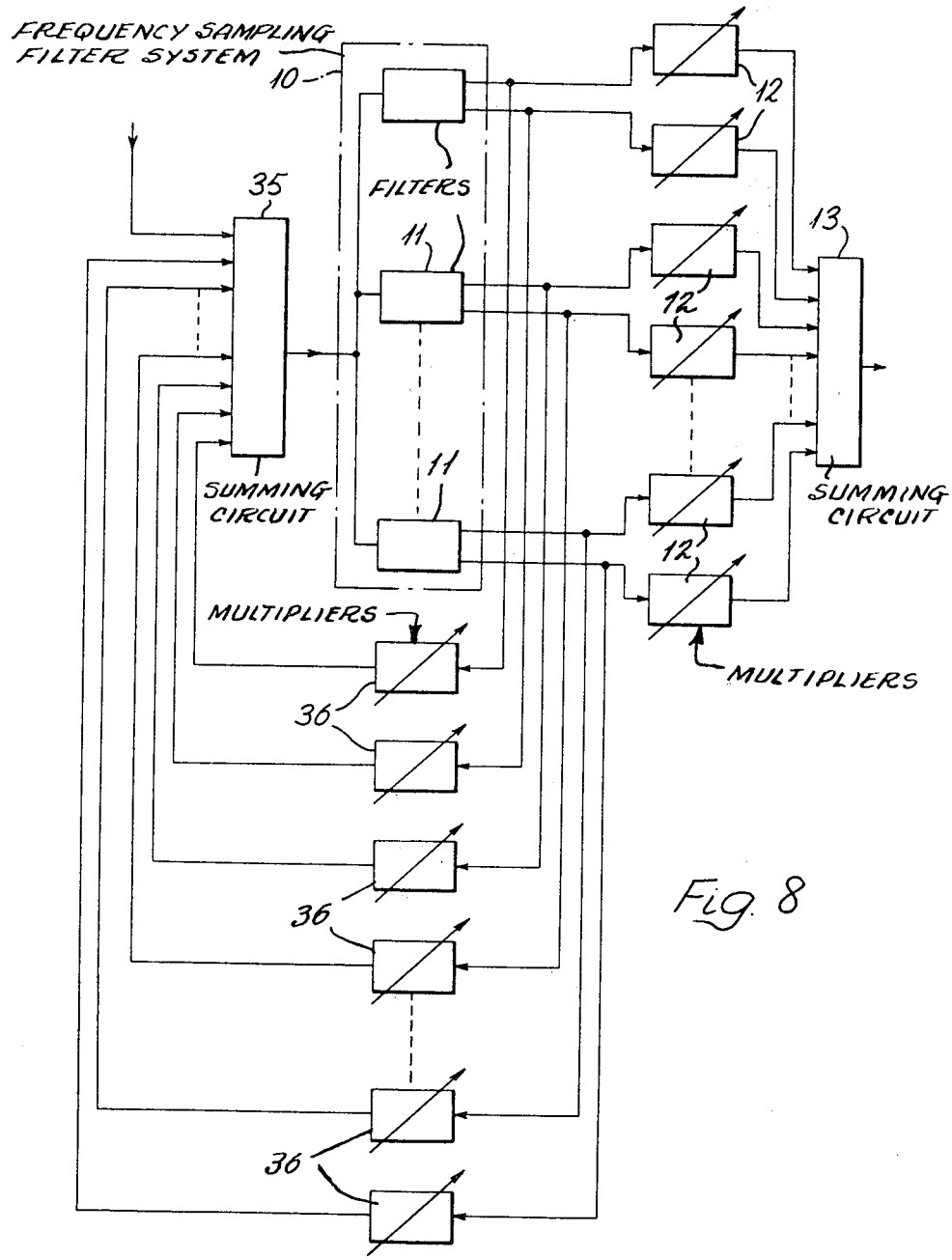

FIG. 8 illustrates a further modification of the system shown in FIG. 2.

Figure 1:
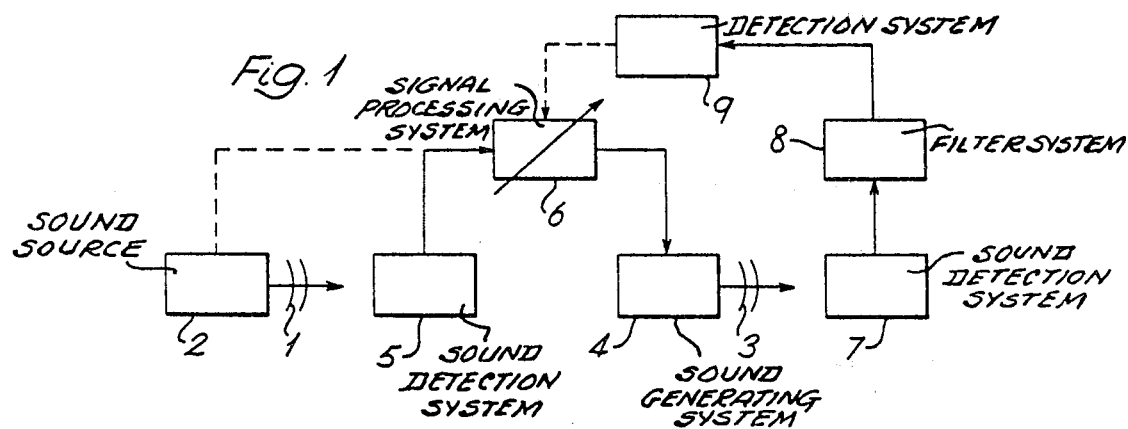
FIG. 1 is a schematic diagram of one possible active sound control system.

In methods of active sound control, an unwanted sound wave is arranged to be attenuated in a selected spatial region by generating a second sound wave which will interfere destructively in that region with the unwanted wave. Certain principles relating to such methods, and examples of their use, are disclosed in British Pat. Nos. 1,456,018 and 1,548,362 and in a paper by the inventor published in Journal of Sound and Vibration, Volume 27 (1973), pages 411–436. FIG. 1 of the accompanying drawings illustrates the basic features of one active sound control system; the unwanted wave 1 emanates from a source 2, and a wave 3 which interferes destructively with the wave 1 is generated by means of a sound generating system 4 incorporating one or more sound sources such as loudspeakers. The operation of the system 4 is controlled by a signal which is normally derived from a sound detection system 5 incorporating one or more sound detectors such as microphones, arranged to be responsive to the wave 1; in some cases (especially where the source 2 has a periodic nature) the control signal for the system 4 can instead be derived directly from the source 2. When using the sound detection system 5, it is necessary to ensure that the performance of the sound control system is not affected by unwanted acoustic interactions between the systems 4 and 5. This can be achieved either by using an appropriately directional array of transducers in one or both of these systems or by simulating the unwanted interactions electrically and subtracting them out.

The control signal is fed to the system 4 via a signal processing system 6 which is required to have a complex transfer function such that satisfactory attenuation of the wave 1 will be achieved in a selected spatial region over an appropriate band of frequencies. For a given installation, the precise form of the transfer function required for optimum performance will depend on factors such as the nature of the acoustic paths involved and the characteristics of the transducers used in the systems 4 and 5; it will therefore be of an arbitrary nature and may vary from time to time. It is thus necessary to make provision for adjustment of the system 6 to enable the performance of the sound control system to be optimised; the adjustment may be effected manually, e.g. for initial setting up of a given system, or may be effected automatically on either an intermittent or a substantially continuous basis, in order to take account of temporal changes in the relevant factors. In either case the adjustment is carried out in response to monitoring of the performance of the sound control system by means of a further sound detection system 7 which is located in the region where attenuation of the wave 1 is to be effected or in an appropriately related region. Signals from the system 7 are fed to a filter system 8 having one or more outputs connected to a detection system 9, so as to enable the performance of the sound control system to be monitored at a series of frequencies within the operating band; optimum performance at a particular frequency will of course be indicated by minimisation of the output of the system 9 for that frequency. The system 8 may consist of a single narrow band filter which is tunable over the relevant frequency range, but it will normally be preferable (particularly in the case of automatic operation) for the system 8 to comprise a set of filters arranged so that separate outputs are derivable from the system 9 in respect of each of the frequencies for which monitoring is required. It will be appreciated that in the case of automatic operation the system 9 is arranged to provide control signals for effecting the adjustment of the signal processing system 6.

From the foregoing it will be seen that a signal processing system according to the invention is eminently suitable for use as the element 6 of the sound control system illustrated in FIG. 1. The basic features of one such signal processing system are illustrated in FIG. 2, where the general reference 10 indicates a frequency sampling filter system comprising a set of N individual filters 11; the filters 11 have amplitude response characteristics which respectively exhibit peaks at a series of harmonically related frequencies given by F, 2F, . . . NF. For the first of the filters 11 the amplitude response characteristic has substantially zero value at frequencies given by 2F, 3F, . . . NF, for the second of the filters 11 the amplitude response characteristic has substantially zero value at frequencies given by F, 3F, . . . NF, and so on. As explained more fully below, there are derived from each filter 11 in-phase and quadrature components, and the 2N outputs from the system 10 are respectively fed via individually adjustable attenuators or multipliers 12 to a summing circuit 13, the output of which constitutes the output of the signal processing system. Adjustment of the transfer function of the system is of course effected by adjustment of the devices 12, the 2N controls involved being essentially non-interactive as a result of the nature of the characteristics of the filters 11 and the orthogonal relationship between the two components derived from each filter 11. When a system as shown in FIG. 2 is used as the element 6 of the sound control system illustrated in FIG. 1, the series of frequencies at which the performance of the system is monitored is of course chosen to correspond to the series F, 2F, . . . NF, the adjustment of the devices 12 associated with the first of the filters 11 being made in response to monitoring at the frequency F, the adjustment of the devices 12 associated with the second of the filters 11 being made in response to monitoring at the frequency 2F, and so on.

The use of a system as shown in FIG. 2 as the element 6 of the sound control system illustrated in FIG. 1 has certain specific advantages besides the general facility for rapid adjustment of the transfer function. Thus, where the sound detection system 5 is used, it is frequently necessary to introduce a pure time delay between sound detection and operation of the sound generating system 4. In this connection it is advantageous that frequency sampling filter systems have a constant delay phase characteristic, which avoids phase distortion effects that would be associated with the use of more conventional types of filter in the signal processing system 6. Optimisation of this system can be made particularly rapidly if the filter delay is chosen to be comparable to the acoustic propagation delay between the systems 5 and 4. Moreover, the non-interactive nature of the controls of the system shown in FIG. 2 offers a particular advantage where the system illustrated in FIG. 1 is to be used to control sound emanating from a source 2 having a periodic nature. The frequencies F, 2F, . . . NF can in this case be synchronised to the source frequencies and convergence to the optimum form of transfer function can then be obtained with a very small number of iterations. If the filter system 10 is constructed using sampled data techniques, the necessary synchronisation can be effected in one operation by synchronising the sampling clock to the source 2, thus automatically ensuring that each filter 11 is correctly aligned on the appropriate source harmonic.

Where the system shown in FIG. 2 is used as the element 6 of the sound control system illustrated in FIG. 1, it will usually be convenient to employ for the element 8 a frequency sampling filter system matched to the system 10 in respect of the series of frequencies at which peaks are respectively exhibited by the amplitude response characteristics of the individual filters of the system, with single outputs from the individual filters fed in parallel to the detection system 9. This is particularly desirable in the case discussed above where the filter system 10 is constructed using sampled data techniques and the sampling clock is synchronised to the source 2; in this case the same arrangement would be appropriate for the frequency sampling filter system used in the observation channel. FIG. 3 shows an arrangement which in other cases may usefully be incorporated in the system illustrated in FIG. 1; the arrangement makes it possible to pinpoint the performance of the system at the precise frequencies F, 2F, . . . NF even when the system excitation takes the form of broad band noise. In this arrangement signals from the sound detection system 7 are fed to a frequency sampling filter system 14 matched to the system 10, via an amplifier 15 having a positive feedback circuit incorporating an adjustable attenuator 16 and a delay device 17, the delay being equal to 1/F so as to give a resonant peak response at the frequencies F, 2F, . . . NF; N outputs from the system 14 are fed respectively to a set of N detectors 18 which constitute the detection system 9. In use of the arrangement, the attenuator 16 is initially set to give a relatively high gain (but less than unity) for the feedback loop, so that the devices 12 incorporated in the signal processing system can be adjusted to optimise the pointwise matching of the required transfer function using narrow band observation. The observation bandwidth is subsequently broadened by resetting the attenuator 16 to reduce the gain of the feedback loop to zero, and the devices 12 can then be readjusted to minimise the mean square error in the matching of the transfer function over the operating frequency band. It will be appreciated that this procedure lends itself readily to automation, and in particular to control by means of a microprocessor.

Turning now to consider possible modes of realisation of the filter system 10, FIG. 4 illustrates one form which the filters 11 may take when using sampled data techniques. In this case use is made of a tapped sampled delay line 19 (which may suitably be of a type employing charge-coupled devices) the line 19 being controlled by a sampling clock 20 and the tappings providing a series of output signals having equal delay increments. These signals, together with the input signal applied to the line 19, are fed to two summing circuits 21 and 22, respectively via two sets of attenuators or multipliers 23 and 24. The devices 23 are chosen so that the proportions in which the signals are summed by the circuit 21 are given by the expression $\cos(2\pi Df)$ and the devices 24 are chosen so that the proportions in which the signals are summed by the circuit 22 are given by the expression $\sin(2\pi Df)$, where D represents the delay for a particular signal and f represents the desired centre frequency of the filter 11. The outputs of the circuits 21 and 22 respectively provide the in-phase and quadrature components to be derived from the filter 11.

When using this arrangement to realise the system 10, it is not necessary to employ a separate delay line 19 for each of the filters 11. The required set of N filters having centre frequencies given by F, 2F, . . . NF can be constructed using a single delay line having an appropriate number of tappings but with separate sets of devices 23 and 24 and circuits 21 and 22 for each filter 11; moreover, by taking advantage of the symmetry and anti-symmetry of the functions cos ($2\pi Df$) and sin ($2\pi Df$) it is possible to effect a considerable reduction in the number of separate devices 23 and 24 required to construct a practical system. It may be noted in this connection that the practical upper frequency limit for operation of the system is dictated by the need to eliminate aliasing effects, and is typically S/3, where S is the sampling frequency. For this typical case, in order to achieve N filters effectively covering the frequency range from zero to S/3 with 2 N variable control parameters, one would require a minimum of 3 N tappings on the delay line 19. This may be contrasted with the use of an unmodified tapped delay line with direct summation of variable proportions of the tapped outputs, where to achieve a similar capability would require the use of 3 N variable control parameters.

Figure 5:
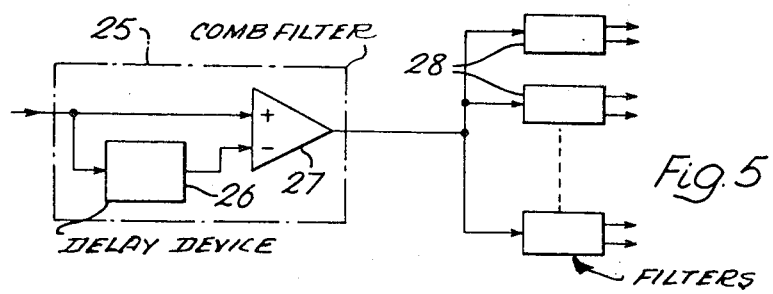
FIG. 5 illustrates another mode of realisation of filters used in a system according to the invention.
Figure 6A:
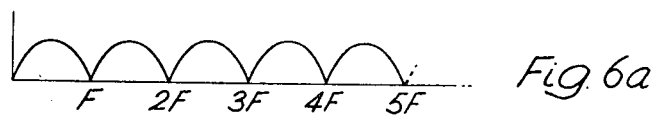
Figure 6B:
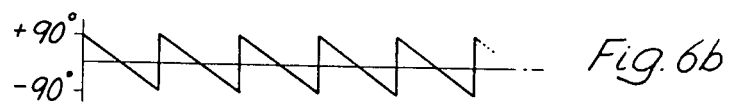
Figure 6C:
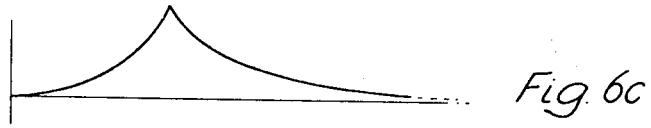
Figure 6D:
Figure 6E:
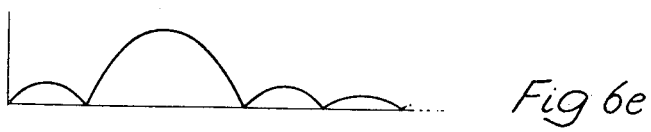
Figure 6F:
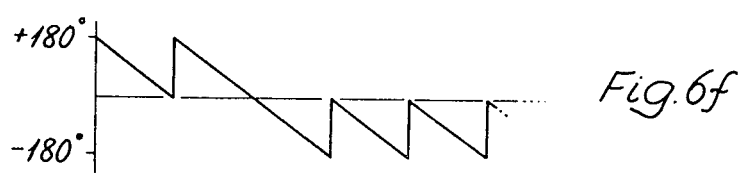

Instead of using sampled data techniques, one can realise the system 10 in a simple analogue form, as illustrated in FIG. 5. Here the individual filters 11 again have a common element, in the form of a comb filter 25. The filter 25 incorporates an analogue delay device 26 of the charge-coupled device type, whose delay time is chosen to be equal to 1/F, and a differential amplifier 27, the input signal to the system 10 being fed to the device 26 and to one input of the amplifier 27 and the output of the device 26 being fed to the other input of the amplifier 27. The output of the filter 25 is applied to a set of N "ring-of-three" second order active filters 28, which are respectively resonant at the frequencies F, 2F, ... NF. For each individual filter 11 constituted by the combination of the filter 25 and one of the filters 28, the in-phase and quadrature components are respectively derived from the outputs of the second and third stages of the relevant filter 28. The characteristics of the in-phase portion of the system are illustrated by the diagrams in FIGS. 6(a) to 6(f), which are plotted on a common linear frequency scale extending horizontally. FIGS. 6(a) and 6(b) respectively show the amplitude and phase response characteristics of the filter 25; as will be seen the former exhibits a series of nulls at frequencies which are integral multiples of F, while the latter varies linearly from $+90°$ to $-90°$ over the frequency ranges 0 to F, F to 2F, and so on. In practice the filter 25 will normally be arranged so that the amplitude response does not go precisely down to zero at the nulls. FIGS. 6(c) and 6(d) respectively show the amplitude and phase response characteristics of the second of the filters 28 (i.e. the one resonant at a frequency of 2F); the former exhibits a sharp peak at the frequency 2F, while the latter has a value of $+90°$ at frequencies up to 2F and a value of $-90°$ at higher frequencies. The Q of the filter 28 is chosen to match the bandwidth of the nulls of the amplitude response of the filter 25. FIGS. 6(e) and 6(f) respectively show the resultant amplitude and phase response characteristics of the combination of the filter 25 and the second of the filters 28, which provides the second of the filters 11; the amplitude response has a peak at the frequency 2F and has substantially zero value at the frequencies given by F, 3F, ... NF, while the phase response varies linearly from $+180°$ to $-180°$ over the frequency range F to 3F. Similar characteristics, with appropriately different centre frequencies, will of course apply for each of the other filters 11. It will readily be seen from the diagrams how the undesirable phase characteristics of conventional filters can be compensated to yield constant delay filters particularly suited for applications in the active sound control field.

As compared with the arrangement illustrated in FIG. 4, the system described above with reference to FIG. 5 offers two advantages. Firstly, it is possible to derive the in-phase and quadrature components directly from appropriate points in the analogue circuits; further, the absence of sampling effects avoids any need for the provision of anti-aliasing filters.

It will of course be appreciated that arrangements similar to those described with reference to FIGS. 4 and 5, but with only a single output derived from each individual filter, can suitably be adopted when it is desired to employ for the element 8 in the system shown in FIG. 1 a frequency sampling filter system matched to the system 10.

It is also possible to envisage the implementation of systems employing the principles discussed above by the use of reprogrammable filter techniques employing either charge-coupled devices or fully digital processing of sampled data. In the latter case, for example, one can use a system basically similar in form to that shown in FIG. 5, but with the delay device 26 replaced by appropriate storage and retrieval of the digitised data derived by sampling the input signal, the amplifier 27 replaced by an arithmetic accumulator, and the filters 28 replaced by first and second order feedback of a delayed output from the accumulator; such a system would in particular be appropriate for use as the filter system 8 shown in FIG. 1, since it can be readily reconfigured to realise any one individual filter at a time by choice of the feedback co-efficients. Similarly the signal processing system illustrated in FIG. 2, with the filter system 10 having a form similar to that described with reference to FIG. 4, can be realised in fully digital form. In this case, the function of the delay line 19 would be represented by appropriate storage and retrieval of the digitised data derived by sampling the input signal, the devices 23 and 24 would be represented by fixed data stored in a memory table, and the devices 12 would be represented by data variable under external control; in order to improve the speed of processing, however, it would be appropriate to re-order the arithmetic manipulations corresponding to the operation of the elements 12, 13, 21, 22, 23 and 24, so as to avoid unnecessary repetition of calculations which can be predetermined.

In explaining this point, it is convenient to note firstly that, in the system illustrated in FIG. 2 using the arrangement described with reference to FIG. 4, the two outputs (denoted respectively by $C_f$ and $S_f$) of each individual filter 11 can be expressed as $$C_f = \Sigma \times (D) \cos (2\pi Df) \text{ and}$$

$$S_f = \Sigma \times (D) \sin (2\pi Df),$$

where f is the centre frequency of the filter, x(D) is the magnitude of the particular signal having a delay D, and the summation is taken over all the possible values of D. In turn the total output of the circuit 13 can be expressed as $\Sigma A_f C_f + B_f S_f$, where $A_f$ and $B_f$ respectively represent the settings of the two devices 12 associated with a particular filter 11, and the summation is taken over all the N filters 11 (i.e. over all the possible values of f); this can be expressed alternatively as $$\Sigma \times (D)\{\Sigma[A_f \cos (2\pi Df) + B_f \sin (2\pi Df)]\}$$

where the outer summation is performed over all possible values of D and the inner summation is performed over all the N filters 11. Clearly the result of the inner summation is fully determined once $A_f$ and $B_f$ are specified for each filter 11, and is independent of the values of x(D). It is therefore unnecessary to recalculate this result for every new signal sample; it can be predetermined and only recomputed in response to variation of the filter control parameters $A_f$ and $B_f$. It will be appreciated that by this technique all of the control features and frequency response characteristics of the system illustrated in FIG. 2 can be achieved.

In the signal processing system shown in FIG. 2, in-phase and quadrature components are derived separately for each of the filters 11. As an alternative, however, it is possible for one of these components to be obtained from the other by integration, which can be performed in common for all the filters. FIG. 7 illustrates a modification of the system of FIG. 2 in which this feature is incorporated. The frequency sampling filter system 10 in this case comprises a set of N individual filters 29 which are basically similar to the filters 11, but which are arranged so that only the in-phase component is derived directly from each filter 29; the N outputs from the system 10 are respectively applied in parallel to two sets of N individually adjustable attenuators or multipliers 30 and 31, which together serve the same purpose as the devices 12 of the system shown in FIG. 2. The outputs of the devices 30 are fed to a summing circuit 32, while the outputs of the devices 31 are fed to an integrating circuit 33, the outputs of both the circuits 32 and 33 being fed to a further summing circuit 34 to provide the output of the signal processing system. The operation of the system shown in FIG. 7 is essentially the same as that of the system shown in FIG. 2, but for certain modes of realisation of the filter system 10 the FIG. 7 system offers the possibility of a reduction in circuit complexity as compared with the FIG. 2 system. In particular, the filters 29 may take the form shown in FIG. 4, but with the devices 24 and circuit 22 omitted.

FIG. 8 illustrates a further possible modification of the signal processing system shown in FIG. 2. In this modification, which enables the full capability of a canonical recursive digital filter to be realised, the system includes besides the elements shown in FIG. 2 a summing circuit 35 and a set of 2 N individually adjustable attenuators or multipliers 36. The outputs of the devices 36, to which are respectively applied the 2 N outputs from the frequency sampling filter system 10, are fed to the circuit 35 together with the input to the signal processing system, the output of the circuit 35 being fed to the input of the system 10. With this system it is necessary to consider the problem of finding an appropriate procedure for adjustment of the devices 12 and 36 to obtain a desired transfer function, since for each frequency point there are now four control parameters instead of two. A suitable procedure is as follows. Initially the devices 36 are set to give zero gain in the feedback loops, and the devices 12 are adjusted so as to give pointwise matching of the desired transfer function exactly as with the FIG. 2 system. Having achieved this, the devices 36 are brought into operation and are varied so as to minimise the broad band mean square error; at the same time, however, the devices 12 must be re-adjusted so that the overall gain of the entire system at the centre frequency of each filter 11 is unchanged, i.e. the adjustments of the devices 12 and 36 after the initial setting up are constrained so that the transfer function still remains pointwise matched at the centre frequencies of the filters 11. This procedure corresponds directly to first matching the transfer function at the centre frequencies of the filters 11, and then matching the slope of the transfer function on either side of each centre frequency. It should be noted that the comparative complexity of the system shown in FIG. 8, together with the requirement that the second stage of the adjustment is a constrained optimisation, means that the system is most easily implemented and adjusted in digital form. With such an implementation the same kind of re-ordering the arithmetic manipulations as has been discussed above can be applied to the parameters corresponding to adjustment of the devices 12 and 36: in this way the properties and characteristics of the system shown in FIG. 8 can be obtained in full, but with considerable economy of calculation.

I claim:

1. A signal processing system comprising:
   means for generating a plurality of signal sets, each of said sets including at least an in-phase component and being generated by performing a filtering operation on a common input signal, each said filtering operation having an amplitude response characteristic which has a peak at one of a series of particular frequencies interrelated by a predetermined function, a substantially zero value at all other particular frequencies of said series and intermediate values at frequencies between the particular frequencies of said series, said one of said series being a different one for each of said filtering operations; and
   means, responsive to said signal sets generating means, for generating an output signal related to the sum of said in-phase components and quadrature components related thereto, said output signal generating means including means, responsive to said signal sets for independently varying the magnitude of the contribution made by each of said components to said sum.

2. A system according to claim 1, in which said signal sets generating means comprises means for obtaining from the input signal a series of signals having different values of delay, and summing signals of said series in proportions given by the expression cos (2πDf) for the in-phase components and sin (2πDf) for the quadrature components, where D is the value of delay for a particular signal of said series, and f has values corresponding to said series of particular frequencies.

3. A system according to claim 1, in which the signal sets generating means comprises a comb filter and a set of second order active filters to each of which the output of the comb filter is applied, the comb filter having an amplitude response characteristic which exhibits nulls at said particular frequencies which are harmonically related and at which the filters of said set are respectively resonant.

4. A system according to claim 1 wherein each of said signal sets includes only said in-phase component.

5. A system according to claim 1 wherein each of said signal sets includes said in-phase component and a quadrature component related thereto.

6. A system according to claim 5, further comprising means for effecting feedback of each of said in-phase and quadrature components to said signal sets generating means, said feedback means independently varying the amplitude of each of said components.

7. An active sound control system comprising:

a signal processing system having means for generating a plurality of signal sets, each of said sets including at least an in-phase component and being generated by performing a filtering operation on a common input signal, each said filtering operation having an amplitude response characteristic which has a peak at one of a series of particular frequencies interrelated by a predetermined function, a substantially zero value at all other particular frequencies of said series and intermediate values at frequencies between the particular frequencies of said series, said one of said series being a different one for each of said filtering operations, and means, responsive to said signal sets generating means, for generating an output signal related to the sum of said in-phase components and quadrature components related thereto, said output signal generating means including means, responsive to said signal sets, for independently varying the magnitude of the contribution made by each of said components to said sum;

means for applying to the signal processing system said input signal representative of an unwanted sound wave to be attenuated in a selected spatial region;

means for utilising the output of the signal processing system to control the generation of a further sound wave which will interfere destructively with the unwanted wave in said region; and means for monitoring the performance of the control system at said series of particular frequencies.

8. A system according to claim 7, in which said monitoring means comprises a sound detection system responsive to the resultant in said region of said unwanted and further sound waves, means for generating a plurality of of further signals respectively by performing a plurality of further filtering operations on the output of said detection system, each of said further filtering operations having an amplitude response characteristic which has a peak at one of said series of particular frequencies, a substantially zero value at all other particular frequencies of said series and intermediate values at frequencies between the particular frequencies of said series, said one of said series being a different one for each of said further filtering operations, and means for detecting said further signals.

* * * * *